United States Patent [19]

Kaplan et al.

[11] Patent Number: 5,283,109
[45] Date of Patent: Feb. 1, 1994

[54] HIGH TEMPERATURE RESISTANT STRUCTURE

[75] Inventors: Richard B. Kaplan, Beverly Hills, Calif.; Hugh O. Pierson, Albuquerque, N. Mex.; J. Grady Sheek, Forth Worth, Tex.; Robert H. Tuffias, Los Angeles; Brian E. Williams, Chatsworth, both of Calif.

[73] Assignee: Ultramet, Pacoima, Calif.

[21] Appl. No.: 684,823

[22] Filed: Apr. 15, 1991

[51] Int. Cl.$^5$ .............................................. C30B 35/00
[52] U.S. Cl. ................................... 428/216; 428/212; 428/408; 428/472; 428/698; 428/704
[58] Field of Search ............... 428/408, 698, 216, 472, 428/212, 704

[56] References Cited

U.S. PATENT DOCUMENTS 4,487,799 12/1984 Galasso et al. ...................... 428/408

FOREIGN PATENT DOCUMENTS 0290322 11/1988 European Pat. Off. .

OTHER PUBLICATIONS

Stife et al "Ceramic Coatings for Carbon-Carbon Composites" Ceramic Bulletin, vol. 67, No. 2, 1988, pp. 368-374.

*Primary Examiner*—A. A. Turner

[57] ABSTRACT

A high temperature resistant structure which is capable of withstanding temperatures well in excess of 2500 degrees Fahrenheit in oxidizing environments for periods of at least several hours. A high temperature resistant substrate such as carbon carbon composite is coated in situ with very thin alternate layers of silicon carbide and a carbide formed from hafnium or zirconium. The coating is preferably formed using chemical vapor deposition procedures.

12 Claims, No Drawings

HIGH TEMPERATURE RESISTANT STRUCTURE

The present invention relates to high temperature structural materials, and more particularly to structures and structural materials wherein a coating comprising a plurality of very thin alternating layers comprised of hafnium or zirconium carbide and silicon carbide is formed in situ on a temperature resistant substrate. Additional advantages may be achieved by the inclusion of hafnium or zirconium boride layers in the coating.

According to the present invention relatively lightweight structures are provided which are capable of withstanding several hours, exposure to an oxidizing environment at temperatures in excess of 2500 and preferably 3200 degrees Fahrenheit.

Previously considerable difficulty had been experienced in providing structures which are capable of withstanding the combination of high temperatures and oxidizing environments for long periods of time. Temperatures in excess of approximately 3000 to 3200 degrees Fahrenheit have generally proven to be destructive within a matter of minutes of most materials which are useful in aircraft and rocket structures and engines. Further, those materials which were capable of withstanding such temperatures often deteriorated rapidly in oxidizing environments at lower temperatures. In order to maximize the performance of engines and air frames, it is necessary to have structural materials which will withstand oxidizing environments at temperatures in excess of approximately 2500 and preferably 3200 degrees Fahrenheit. Structural materials suitable for these purposes must withstand these severe conditions for at least several hours and preferably several days.

Further, there is a very great need for structural materials which will withstand oxidizing environments and temperatures in excess of approximately 3500 degrees Fahrenheit for at least several minutes and preferably an hour or more. Previously, structural materials to satisfy these conditions were generally not available. In addition to maintaining its structural integrity under these severe conditions, a structural material must also retain substantial structural strength or it will not be capable of performing its intended function.

The performance of an aircraft or space craft is significantly enhanced by reducing the weight of the structural elements which go to make up the craft. Previous expedients generally included the use of relatively heavy structural materials. In certain applications such as turbine engine components, the structural materials which were subject to the most severe operating conditions were generally actively cooled during operation to prevent their rapid degradation and disintegration. These actively cooled turbine engine components were generally constructed of refractory metals and superalloys. Elimination of the weight, operating inefficiency and mechanical complexity which is dictated by the necessity of actively cooling these structural components reduces weight and improves reliability.

In aerospace applications materials are operated at or near their capacity with regard to temperature, stress and environment. These limits must be extended for performance improvements to be realized. Very few materials, however, are capable of withstanding very high temperature oxidizing environments. Carbon-carbon composites can be tailored to provide the necessary structural strength. However, unprotected carbon begins to oxidize below 900 degrees Fahrenheit and oxidizes very rapidly as the temperature increases.

Carbon-carbon composites consist of carbon fibers in a carbonaceous matrix. The matrix is generally a crystalline carbon. The carbon fibers are generally provided in the form of tows, tapes or woven cloth. The physical form and strength of carbon-carbon materials can be tailored through a wide variety of configurations including two dimensional, three dimensional and other multidimensional variations. The use of unprotected carbon-carbon materials in such applications as hot section components for advanced turbine engines and other aerospace hardware is precluded, however, by the low level of oxidation resistance which is inherent in this material. Previous expedients which have been proposed in an effort to overcome this low resistance to oxidation have included the use of silicon carbide coatings on the surfaces of carbon-carbon composite materials. This has been satisfactory only in temperature ranges below approximately 2500 degrees Fahrenheit. At temperatures above approximately 2500 degrees Fahrenheit the silicon coated carbon-carbon structures become generally unpredictable and will certainly fail within a relatively short time of no more than a few hours at the most. At temperatures in excess of 3000 degrees Fahrenheit silicon coated carbon-carbon composite structures fail within a very few minutes and some times within a few seconds.

One of the serious problems encountered in attempting to protect carbon-carbon composites with silicon carbide coatings is that the carbon-carbon composites have very low coefficients of thermal expansion as compared with the silicon carbide coating. The mismatched coefficients of thermal expansion cause the silicon carbide coatings to crack as temperature cycling occurs. This problem is exacerbated by repeated heating and cooling as is encountered in the operation of turbine engines and the like. Previously, silicon carbide coatings were formed in situ on the surface of the carbon-carbon composite, generally by pack cementation procedures, at elevated temperatures. Cracks occurred when the structure was cooled down from the deposition temperature due to the mismatch between the coefficients of thermal expansion.

According to the present invention, these and other difficulties of the prior art have been overcome by way of a high temperature resistant structure which is capable of withstanding prolonged temperatures in excess of approximately 2500 and preferably 3200 degrees Fahrenheit in an oxidizing environment. The structure comprises a high temperature resistant substrate such as carbon-carbon composite, ceramic, or the like, coated with a high temperature oxidation resistant coating. The oxidation resistant coating is comprised of formed in situ thin alternate layers of hafnium or zirconium carbide and silicon carbide. For added protection throughout a wider operating temperature range hafnium or zirconium boride layers may be included in the coating. Hafnium and zirconium are Group IVB metals which have melting points in excess of about 1850 degrees centigrade. Each of the thin alternate layers is generally no more than a few microns thick, preferably from approximately 1 to 10 microns, with a total thickness for the coating of from approximately 5 to 20 mils. The outermost layer which is exposed to the surrounding environment is generally preferably silicon carbide. The first layer of the coating forms an interlayer between the coating and the substrate. The interlayer is generally preferably silicon carbide where the substrate is a carbon-carbon composite, but may be a different material particularly where a ceramic or other material is used as the substrate. If desired, the interlayer may be selected so as to minimize as much as possible the effect of the mismatch in the coefficients of thermal expansion between the coating and the substrate. Also, the interlayer may be selected so as to improve the adhesion of the coating to the substrate. The interlayer is generally thicker than the other layers so as to accommodate some irregularities in the surface of the substrate.

The alternate layers of hafnium carbide and silicon carbide are applied to the refractory substrate by chemical vapor deposition or sputtering techniques. Preferably, chemical vapor deposition procedures are used because the sputtering techniques are limited in both their application rates and the configurations of substrates to which coatings may be applied. Although the individual alternate layers of silicon carbide and hafnium carbide are quite thin, it has been found that it is necessary to utilize alternate layers rather than coapplying these materials. Monolithic coatings comprised of codeposited silicon carbide and hafnium degrade much more quickly in high temperature oxidizing environments than do very thin alternating layers of these materials. Also, codeposites of these materials are difficult to form. Coatings consisting of hafnium carbide by itself are known to resist very high temperatures for short periods of time. Unfortunately, hafnium carbide coatings oxidize quickly so that at temperatures as low as 2500 degrees Fahrenheit the service life of a hafnium carbide coated structure is only a matter of thirty minutes or less.

Silicon carbide coatings have been widely used, particularly on carbon-carbon composites, to prevent those composites from being oxidized at high temperatures. Such materials have been used, for example, for heat shields on the Space Shuttle. Unfortunately, such silicon carbide coatings degenerate and fail in less than approximately thirty minutes at approximately 3000 degrees Fahrenheit.

According to the present invention, a coating system and fabrication process are provided which will permit long term operation of carbon-carbon composites at temperatures up to approximately 3270 degrees Fahrenheit in oxidizing environments. Additionally, short term protection is provided up to approximately 3500 degrees Fahrenheit. High temperature resistant or refractory materials according to the present invention find utility in, for example, aerospace applications such as the hot sections of turbine engines, rocket engines and as heat shields.

In general the coating systems according to the present invention comprise alternating very thin layers of hafnium or zirconium carbide and silicon carbide deposited preferably by chemical vapor deposition on a refractory substrate. Other deposition procedures such as sputtering may be employed if desired.

In a preferred embodiment a carbon-carbon composite structure is formed according to conventional procedures for the preparation of such a structure. The structure is then placed within a reaction chamber where temperatures, pressures and the surrounding atmosphere may be controlled. The reaction chamber is sealed and purged with, for example, argon gas. The input gases for the desired reactions are preferably methyltrichlorosilane (MTS), hydrogen, chlorine, methane, argon and hafnium or zirconium tetrachloride. The hafnium or zirconium tetrachloride is preferably generated in the reaction chamber during the operation of the reactor by flowing chlorine gas through hafnium or zirconium metal which has been heated to at least approximately 950 degrees Fahrenheit. The argon is used to initially and finally purge the system, and as a diluent gas to control the deposition rate. The partial gas pressure is maintained at from approximately 5 to 500 torr. The substrate is placed in the reactor, preferably on a rotating support, and a thermocouple is attached to permit the monitoring of its temperature during the deposition process. The reactor is heated, preferably by induction, to the desired reaction temperature. The substrate which is the target of the deposition is heated to from approximately 2000 to 2600, and preferably from about 2150 to 2250 degrees Fahrenheit. The rate and nature of the deposit on the substrate are controlled by adjusting the various gas flow rates. The conditions are adjusted so that there is little or no nucleation in the gas phase, that is, the formation of powders in the gas stream is avoided. Comparable results are achieved by substituting other sources of silicon such as dichlorodimethylsilane in place of the methyltrichlorosilane, and other sources of hafnium or zirconium such as hafnium or zirconium chloride directly or fluorides or other hafnium or zirconium compounds may be used in place of the formed in situ chloride.

In a preferred embodiment the hafnium metal was heated to approximately 1020 degrees Fahrenheit and the carbon-carbon composite part to be coated was mounted on a rotating platform and heated by induction to about 2190 degrees Fahrenheit. The reaction chamber was purged with argon and the partial gas pressure was adjusted to about 20 torr. The methyltrichlorosilane was allowed to flow into the reaction chamber. The methyltrichlorosilane decomposed at the deposition temperature (the temperature to which the part was heated). The decomposition of the methyltrichlorosilane formed silicon carbide and hydrogen chloride. The silicon carbide was deposited as the initial coating on the carbon-carbon substrate. After approximately two minutes chlorine gas was flowed through the heated hafnium metal to produce a stream of hafnium tetrachloride. The hafnium tetrachloride reacted with the methyltrichlorosilane at the surface of the part, resulting in a hafnium carbide layer being deposited on top of the initial silicon carbide layer. The chloride gas was then turned on and off at two minute intervals for a total deposition time of approximately one hour. Silicon carbide was deposited as the final layer on the outer surface of the formed in situ protective coating. The individual layers in the coating formed by this procedure were approximately five microns thick and the total thickness of the coating was approximately 6 mils. Repetition of this procedure using zirconium carbide produces comparable results. Likewise, repetition of this process with ceramic, graphite, niobium, and niobium alloy substrates produces satisfactory structures which are capable of operating in oxidizing environments up to the structural limits of the substrate. The substrate may be selected with the view of minimizing the difference between the coefficients of thermal expansion between the substrate and the coating. For example, graphite has a coefficient of expansion which is closer to that of the coating than is carbon-carbon composite.

Upon cooling it was observed that there were microcracks in the coating on the carbon-carbon composite substrate. However, it did not appear that the cracks extended entirely through the coating. Also, the cracks were observed to be much thinner than those which customarily occur in silicon carbide coatings. Microscopic examination of a cross-section of the structure revealed the presence of very thin layers in the coating.

The coated structure thus prepared was subjected to temperatures of 3000, 3180 and 3250 degrees Fahrenheit in air for several hours. The weight loss of the sample was neglible. It was observed that there was a slight weight loss initially with very little further weight loss after the first few minutes. Microscopic examination of a cross-section of the coated substrate after heating showed that the layers were generally no longer visible except for the silicon carbide interlayer and what appeared to be a newly formed oxide layer on the outer surface of the coating and in the cracks in the coating. It is suspected that an oxide film forms during the initial exposure which further inhibits any further oxidation of the coating. There was no evidence of spalling.

The weight loss was observed to be much more rapid at 3500 degrees Fahrenheit, and the rate of weight loss did not decrease with time. It was observed that the specimen which was subjected to 3500 degrees Fahrenheit in air had not suffered catastrophic spalling or cracking but rather had apparently undergone rapid oxidization.

In an attempt to minimize cracking, a carbon-carbon composite structure was prepared and coated with a carbon glue. The carbon glue which was used was in the form of a paste comprising carbon powder and a liquid carrier. The paste was applied to the uneven surface of the carbon-carbon composite to a nominal thickness of about two mils. The carbon paste was applied to such a thickness that it provided a level surface. The carbon paste layer was cured in situ and the above described carbon vapor deposition procedure was utilized to apply a coating of hafnium carbide-silicon carbide layers. It was observed that upon cooling down from the chemical vapor deposition process, large areas of the structure exhibited no surface cracks and the few cracks which did appear on the surface were very small as compared with those that appeared in the structures which did not have the carbon glue interlayer. The carbon glue apparently served to form a slightly ductile interlayer which absorbed through plastic deformation some of the stress caused by the mismatched coefficients of thermal expansion. Carbon glue interlayers of from approximately 1 to 3 mils in thickness appear to be beneficial in minimizing cracking.

The conditions of the chemical vapor deposition procedure were adjusted so that hafnium carbide and silicon carbide were codeposited in one more or less monolythic layer. Difficulty was experienced in producing a uniform deposit. When the resulting structure was subjected to temperatures of approximately 3200 degrees Fahrenheit, a significant weight loss was observed and the rate of weight loss did not decrease significantly after the first few minutes. Apparently the codeposition of hafnium carbide and silicon carbide is not as effective in protecting against oxidation as is the alternate deposition of very thin alternate layers of these materials.

Varying the chemical vapor deposition operating parameters permits adjustment of the thickness of the respective hafnium or zirconium carbide and silicon carbide layers. Preferably, the individual layers, except for the interlayer, are from about 1 to 10 microns in thickness and the coating is from 5 to 30, preferably 10 to 20 mils in thickness. The interlayer may be as much as 20 microns or more, if desired. The layers need not be of uniform thickness. Where the substrate is a carbon-carbon composite, it is preferred to have silicon carbide as the first in situ layer formed on the surface of the carbon-carbon composite and to have silicon carbide as the final layer which is exposed to the environment at the surface of the coating.

One sample was removed from the reaction chamber after a silicon carbide interlayer was applied. Later it was returned to the reaction chamber and an effort was made to apply a layer of hafnium carbide. The hafnium carbide layer bonded very poorly to the silcon carbide. The coating process is preferably continuous with no interruptions between the formation of the alternating carbide layers.

The coating appears to have no effect on the physical properties, such as strength, of the underlying substrate. The surface of the substrate which is bonded to the first layer of the coating does not appear to have suffered any physical damage by reason of the application of the coating.

The coating according to the present invention may be applied by sputtering techniques if desired. Sputtering generally is less favored than chemical vapor deposition because it is slower and it is limited to line of sight deposition. Structures with complicated surfaces are generally very difficult or impossible to coat using sputtering techniques. Also, thick deposits are difficult or impossible to form with sputtering techniques.

In a sputtering application sources of silicon carbide and hafnium carbide are vaporized and condensed on the surface of the substrate. Because the surface of the substrate is at relatively low temperatures, poor bond strength usually results.

While carbon-carbon composites are the preferred substrate material, the coating may be applied according to the present invention to other substrates including, for example, ceramics, titanium aluminides, refractory metals, graphite and the like. For operating temperatures above 2500 degrees centigrade, in addition to carbon-carbon substrates, ceramics, graphite, niobium, niobium alloys and compounds and metal matrix materials are preferred.

The substitution of zirconium carbide for hafnium carbide results in a satisfactory bi-layer protective coating when combined with silicon carbide as described above. Zirconium tetrachloride is used as the precursor. It is generated by flowing chlorine gas through zirconium metal which has been heated to about 550 degrees centigrade. The substrate temperature is maintained at from approximately 2000 to 2600 degrees Fahrenheit.

The substitution of hafnium or zirconium diboride in place of the hafnium carbide gives a protective bi-layer coating with silicon carbide which is satisfactory at operating temperatures up to about 2700 degrees Fahrenheit. Above approximately this temperature substantial and continuous weight loss occurs. Hafnium or zirconium diboride is deposited by reacting hydrogen and hafnium or zirconium chloride with boron trichloride or an alternative boron source such as diborane.

The hafnium carbide-silicon carbide bi-layer system offers substantial oxidation protection above about 2500 degrees Fahrenheit, but it can oxidize catastrophically if held at temperatures of approximately 1800 degrees Fahrenheit. Apparently the coating system is microcracked and below about 2000 degrees Fahrenheit silicon dioxide does not form and flow into the microcracks. Above this temperature the silicon dioxide is a viscous liquid which apparently tends to flow into the microcracks to prevent oxygen from attacking the substate. Hafnium or zirconium diboride bi-layer coatings with silicon carbide do not exhibit oxidation failure modes in the 1800 degree Fahrenheit region. A tri-layered coating consisting of alternate layers of silicon carbide, hafnium or zirconium diboride and hafnium or zirconium carbide does not exhibit an oxidation failure mode in the 1800 degrees Fahrenheit region.

In a preferred embodiment for the preparation of a tri-layer coating a closed reactor is provided, hafnium metal is heated to approximately 1020 degrees Fahrenheit and a carbon-carbon composite substrate to be coated is placed in the reactor on a rotating pedestal and heated by induction to about 2190 degrees Fahrenheit. The partial gas pressure in the reactor is adjusted to about 20 torr. Methyltrichlorosilane (MTS) is allowed to flow into the reaction chamber. The MTS decomposes at the deposition temperature to form silicon carbide and hydrogen chloride. The silicon carbide is deposited as the initial coating on the substrate. When the inital silicon carbide coating has reached the desired thickness chlorine gas is flowed through heated hafnium metal to produce a stream of hafnium chloride. The hafnium chloride reacts with the MTS at the surface of the part to form a layer of hafnium carbide on top of the initial silicon carbide layer. After approximately two minutes the MTS is turned off and a mixture of boron trichloride and hydrogen gas are allowed to flow into the reactor for approximately two minutes. The boron trichloride and hydrogen react with the hafnium chloride at the surface of the part to form a hafnium boride layer on top of the hafnium carbide layer. After approximately two minutes this gas flow is turned off and the MTS is admitted for about two minutes to form another silicon carbide layer. The flows of reactants are thus alternated about every two minutes for a total of approximately one hour. The final layer is silicon carbide. The resulting coating does not fail from oxidization at approximately 1800 degrees Fahrenheit and is stable up to temperatures in excess of approximately 3000 degrees Fahrenheit. The use of zirconium instead of hafnium produces comparable results.

What has been described are preferred embodiments in which modifications and changes may be made without departing from the spirit and scope of the accompanying claims.

What is claimed is:

1. A refractory structure capable of withstanding prolonged temperatures in excess of at least about 2500 degrees Fahrenheit in an oxidizing environment comprising: a high temperature resistant carbon-carbon composite substrate comprising carbon fibers in a crystalline carbon matrix, and a high temperature oxidation resistant coating, said coating being formed in situ on the surface of said substrate and comprising very thin alternate layers of silicon carbide and a carbide formed from a Group IVB metal having a melting point in excess of about 1850 degrees centigrade, each of said layers being visible under microscopic cross-sectional examination when initially deposited and generally being less than approximately 10 microns thick, said coating having a total thickness of from approximately 5 to 30 mils.

2. A temperature resistant structure of claim 1 wherein each of said layers is from about 1 to 10 microns thick.

3. A high temperature resistant structure of claim 1 wherein said coating is from approximately 5 to 20 mils thick.

4. A high temperature resistant structure of claim 1 wherein said substrate is a carbon-carbon composite.

5. A high temperature resistant structure of claim 1 wherein said substrate is a ceramic.

6. A high temperature resistant structure of claim 1 wherein said substrate is graphite.

7. A high temperature resistant structure of claim 1 wherein said substrate is a metal.

8. A high temperature resistant structure of claim 1 wherein there is a formed in situ carbon interlayer between said substrate and said coating.

9. A high temperature resistant structure of claim 1 wherein said said coating comprises alternate layers of silicon carbide, hafnium carbide and hafnium boride.

10. A high temperature resistant structure of claim 1 wherein said coating comprises alternate layers of silicon carbide and hafnium carbide.

11. A high temperature resistant structure of claim 1 wherein said coating comprises alternate layers of silicon carbide and zirconium carbide.

12. A high temperature resistant structure capable of withstanding prolonged temperatures in excess of at least about 2500 degrees Fahrenheit in an oxidizing environment comprising: a high temperature resistant substrate and a high temperature oxidation resistant coating, said coating being formed in situ on the surface of said substrate and comprising very thin alternate layers of silicon carbide and a carbide formed from a Group IVB metal having a melting point greater than about 1850 degrees centigrade, said substrate being capable of maintaining its structural integrity at temperatures in excess of at least about 2500 degrees Fahrenheit, said very thin alternate layers being of such a thickness that they are visible under microscopic cross-sectional examination when initially deposited and are generally no longer visible under such examination after heating in air for several hours at temperatures from 3000 to 3250 degrees Fahrenheit.

* * * * *